United States Patent [19]

Kubo

[11] Patent Number: 5,280,639
[45] Date of Patent: Jan. 18, 1994

[54] DOUBLE SUPER-HETERODYNE TUNER

[75] Inventor: Kazuhiko Kubo, Mishima, Japan

[73] Assignee: Matsushita Electric Industrial Co., Ltd., Kadoma, Japan

[21] Appl. No.: 749,606

[22] Filed: Aug. 26, 1991

[30] Foreign Application Priority Data

Aug. 30, 1990 [JP] Japan .................. 2-230360

[51] Int. Cl.5 ........................................ H04B 10/00
[52] U.S. Cl. ............... 455/169.1; 455/178.1; 455/182.2; 455/182.3; 455/192.2; 455/192.3; 455/315; 455/316
[58] Field of Search .............. 455/169.1, 173.1, 178.1, 455/182, 192, 193, 314, 315, 316, 182.1, 182.2, 182.3, 192.1, 192.2, 192.3, 193.2, 193.3

[56] References Cited

U.S. PATENT DOCUMENTS

| | | | |
|---|---|---|---|
| 4,061,981 | 12/1977 | Endres et al. | 455/169.1 |
| 4,334,323 | 6/1982 | Moore | 455/179 |
| 4,379,269 | 4/1983 | Ijichi | 330/277 |
| 4,419,768 | 12/1983 | Yamashita et al. | 455/315 |
| 4,817,195 | 3/1989 | Kubo et al. | 455/192 |
| 4,984,296 | 1/1991 | Schotz | 455/193 |

FOREIGN PATENT DOCUMENTS 0236736 9/1989 Japan .................. 455/315

OTHER PUBLICATIONS

"Wide-Band Double Conversion Tuner", Yasukazu Kamei et al., Sanyo Technical Review, vol. 21, No. 2, Jun. 1989, pp. 49–55.

Primary Examiner—Reinhard J. Eisenzopf
Assistant Examiner—Timothy H. Keough
Attorney, Agent, or Firm—Wenderoth, Lind & Ponack

[57] ABSTRACT

A double super-heterodyne tuner provided with an up-converting section and a down-converting section, and including an input filter constituted by single tuning to be supplied with an input signal, an RF amplifier for amplifying the signal passing through the input filter, and an inter-stage tuning circuit constituted by single tuning connected to an output end of the RF amplifier and provided at an input portion of the up-converting section. The input filter and the inter-stage tuning circuit are supplied with a tuning voltage different from that supplied to a first local oscillator so as to alter its filter characteristics for simplification of the circuit construction and improvement of NF (noise factor).

3 Claims, 4 Drawing Sheets

DOUBLE SUPER-HETERODYNE TUNER

BACKGROUND OF THE INVENTION

The present invention generally relates to a tuner for signal reception, and more particularly, to a double super-heterodyne tuner suitable for receiving television broadcasting signals and CATV (cable television) signals, etc.

It has been a recent trend that multi-channel signal reception has been widely adopted, for example, as in CATV, and double super-heterodyne tuners which are advantageous for multi-channel signal reception are being introduced for the purpose.

Hereinafter, a conventional double super-heterodyne tuner will be briefly explained with reference to FIGS. 1 to 3.

In FIG. 1, there is shown a block diagram of the known double super-heterodyne tuner system, which includes input filters 1, 2 and 3 respectively having different band-pass regions and sequentially coupled with an AGC (Automatic gain control) circuit 4 constituted by a pin attenuator, etc., an RF amplifier 5, a first mixer 6 connected to a first local oscillator 7 having a variable oscillating frequency, a first IF amplifier 8, a first IF band-pass filter 9, a second mixer 10 connected to a second local oscillator 11 having a fixed oscillating frequency, and a second IF amplifier 12 connected to an output terminal B as illustrated.

In operation, the television signal inputted from a terminal A passes through one of the input filters 1 to 3 and is applied to the AGC circuit 4. The signal, gain controlled by the AGC circuit 4, is amplified at the broadband RF amplifier 5 and then inputted to the first mixer 6, to which an output signal of the first local oscillator 7 is also applied, with a difference signal between an output signal of the RF amplifier 5 and the output signal of the first local oscillator 7 being produced at an output of said first mixer 6. This difference signal is applied to the first IF amplifier 8, and the signal amplified thereat is filtered by the band-pass filter 9 to be further applied to the second mixer 10, where the signal is mixed with the signal of the second local oscillator 11, and the mixed output signal from the second mixer 10 is outputted from the terminal B as the second IF signal through the second IF amplifier 12.

Subsequently, the input filters 1 to 3 referred to above in FIG. 1 will be explained more in detail with reference to FIGS. 2 and 3.

FIG. 2 schematically shows one example of the input filter, in which a generally known Chebyshev type low pass filter is combined with a high-pass filter, and which is normally designed for an input and output impedance of 50Ω.

FIG. 3 shows a circuit diagram in which three band-pass filters each as shown in FIG. 2 are combined with each other so as to be capable of being changed over therebetween.

As shown in FIG. 3, the circuit generally includes band-pass filters 20, 21 and 22, and input and output terminals F and G coupled with the band-pass filters 20, 21 and 22 through switching diodes 23, 24, 25, 26, 27, 28, 29, 30, 31, 32, 33 and 34 which are grounded via capacitors and resistors, with junctions between the switching diodes 24 and 25, 28 and 29, and 32 and 33 being connected to terminals C, D and E through corresponding resistors as illustrated.

In the circuit construction of FIG. 3, the television signal or CATV signal inputted from the input terminal F is selected for the filter to pass through by band-pass voltages applied to the terminals C, D and E. For example, in the case where the voltage for the terminal C is 0V, and that for the terminals D and E is +BV, the diodes 23 and 26 are turned ON, while the diodes 24 and 25 are turned OFF, and the signal passes through the band-pass filter 20. Meanwhile, since the diodes 28, 29, 32 and 33 are turned ON, and the diodes 27, 30, 31 and 34 are turned OFF, the signal does not pass through the band-pass filters 21 and 22. The three band-pass filters 20, 21 and 22 are respectively separated in the pass-band regions, e.g. as in the VHF low band, VHF high band, and CATV band.

However, the conventional construction as described so far has problems in that the filters are complicated in structure as shown in FIGS. 2 and 3, with the change-over circuits being increased in number, while the AGC circuit is separately required, thus resulting in increased costs.

SUMMARY OF THE INVENTION

Accordingly, an essential object of the present invention is to provide a double super-heterodyne tuner which is simplified in construction, and can be readily manufactured at a low cost.

Another object of the present invention is to provide a double super-heterodyne tuner of the above described type, which is stable in functioning with a high reliability.

In accomplishing these and other objects, the present invention provides a double super-heterodyne tuner which includes an input filter of single tuning, an RF amplifier for amplifying the signal passing through said input filter, and a single tuning circuit to become an output load of said RF amplifier, while a tuning voltage to be supplied to the input filter and the output side single tuning circuit is adapted to be generated by an output voltage of a D/A converter controlled by a micro-computer.

More specifically, according to one aspect of the present invention, there is provided a double super-heterodyne tuner which includes an input filter constituted by single tuning, an RF amplifier connected to an output of the input filter, and an inter-stage tuning circuit constituted by single tuning and connected to an output of said RF amplifier. The input filter and inter-stage tuning circuit are supplied with a tuning voltage different from that supplied to a first local oscillator connected at a stage subsequent to said inter-stage tuning circuit.

By the arrangement according to the present invention as described above, the circuit construction from the input filter to the output side single tuning circuit is simplified, with a consequent reduction in the number of parts required and the manufacturing cost.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Figure 1:
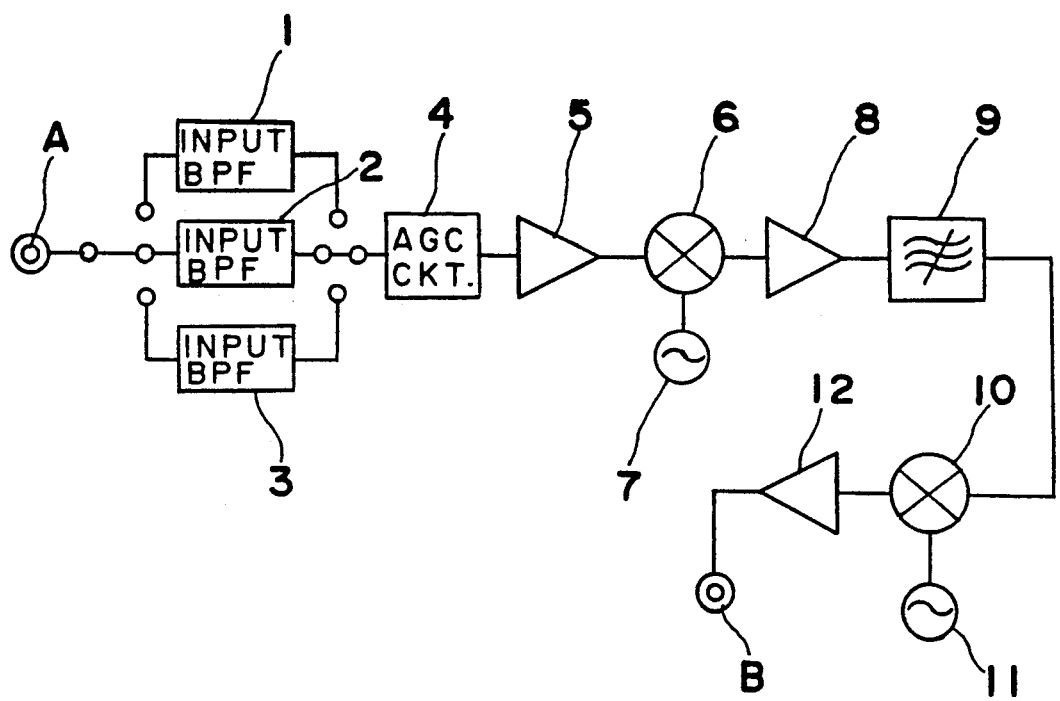
FIG. 1 is a block diagram for a conventional double super-heterodyne tuner (already referred to)
Figure 2:
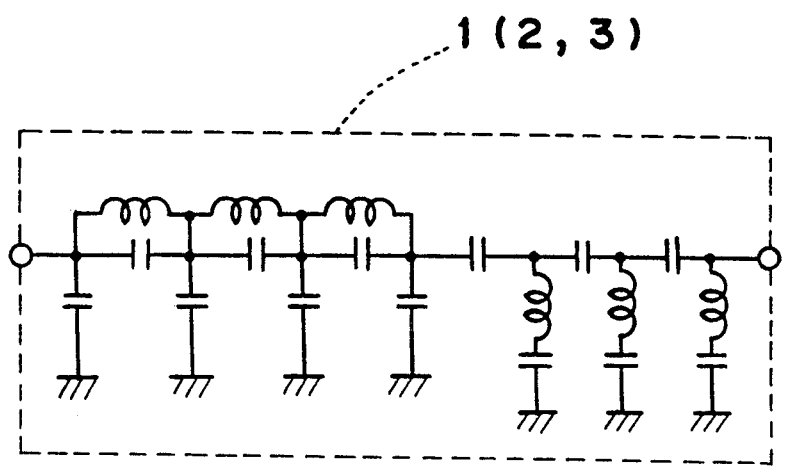
FIG. 2 is a circuit diagram showing a specific construction of an input band-pass filter employed in the tuner of FIG. 1 (already referred to)
Figure 3:
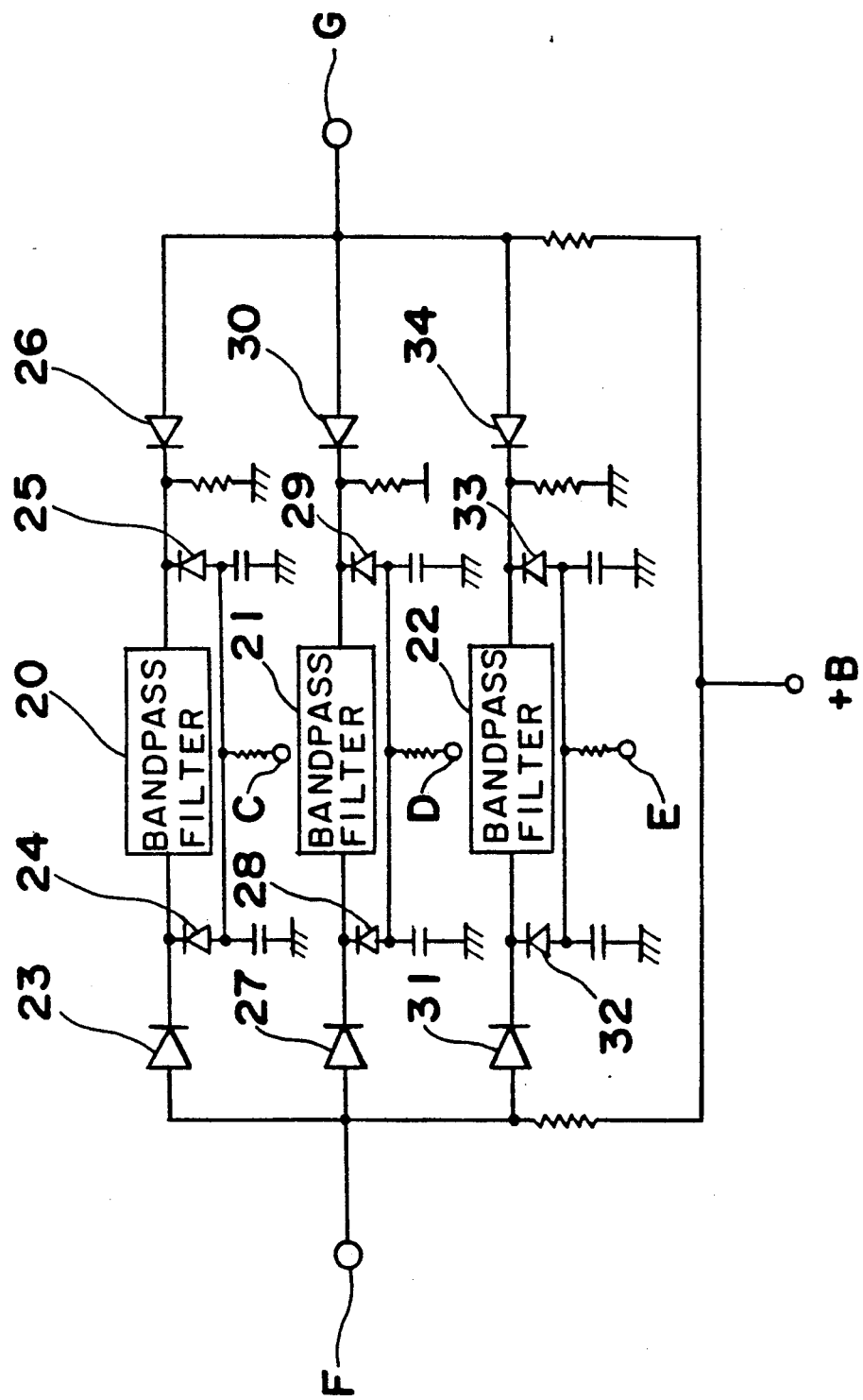
FIG. 3 is a circuit diagram showing the input band-pass filters coupled to switching circuits in FIG. 1 (already referred to)

Before the description of the present invention proceeds, it is to be noted that like parts are designated by like reference numerals throughout the accompanying drawings.

Figure 4:
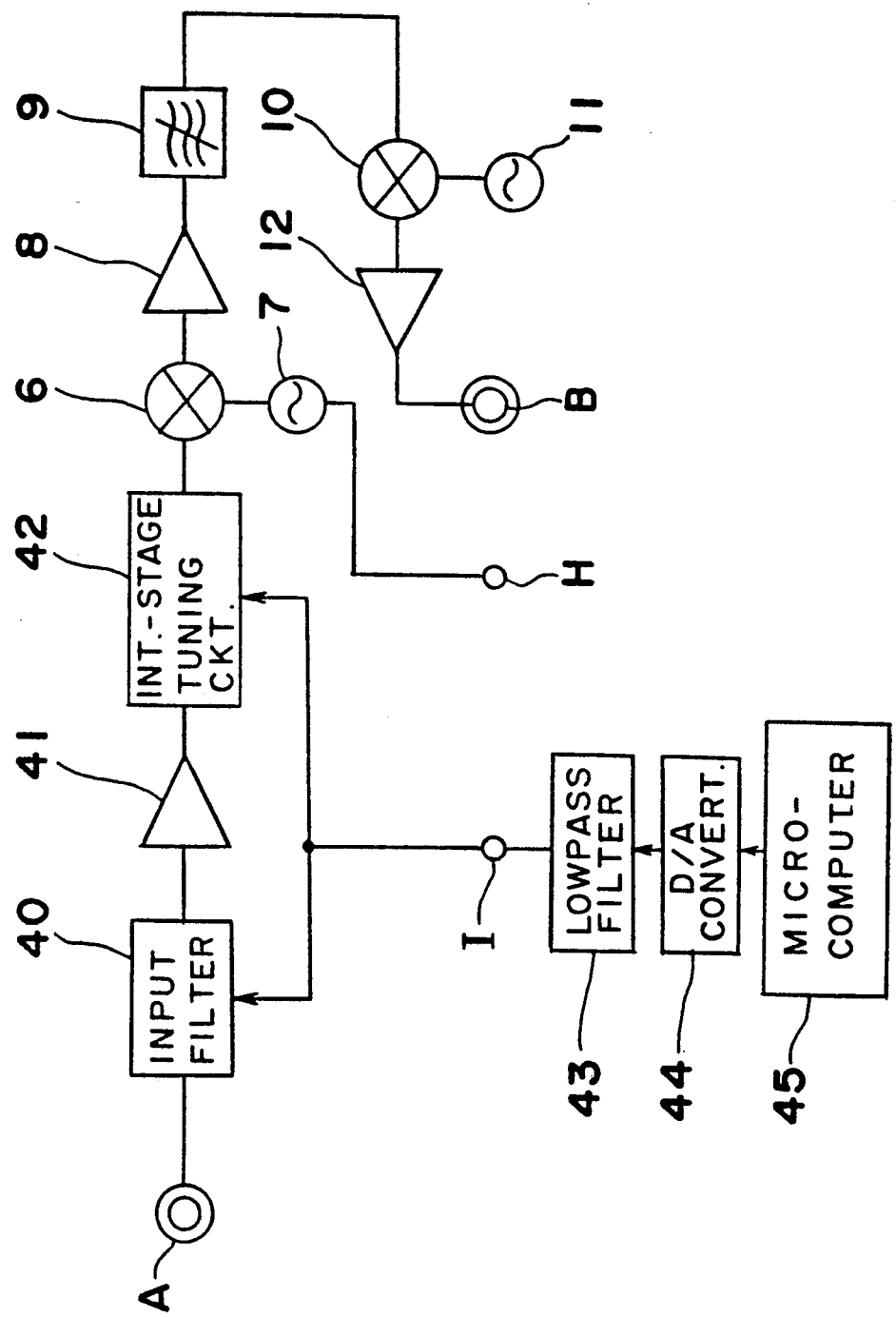
FIG. 4 is block diagram showing a general construction of a double super-heterodyne tuner according to one preferred embodiment of the present invention.

Referring now to the drawings, there is shown in FIG. 4, a block diagram of a double super-heterodyne tuner according to one preferred embodiment of the present invention, which includes an input single tuning filter 40 connected to an input terminal A and coupled, at its output, to an inter-stage or output single tuning circuit 42 through an RF amplifier 41, with an output of said output single tuning circuit 42 being successively connected to the first mixer 6 which is also connected to a first local oscillator 7 having a variable oscillating frequency, a first IF amplifier 8, a band-pass filter 9, a second mixer 10 connected to a second local oscillator 11 having a fixed oscillating frequency, and a second IF amplifier 12 connected at its output to the output terminal B, these elements being the same components as referred to earlier with reference to the conventional double super-heterodyne tuner of FIG. 1. The RF amplifier 41, the input single tuning filter 40 and the output single tuning circuit 42 are subjected to the high impedance coupling, and are further coupled to a low-pass filter 43, a D/A converter 44, and a micro-computer 45. The low-pass filter 43 supplies its output signal (D.C. voltage) to the input single tuning filter 40 and the output single tuning circuit 42 through a terminal I, while the D/A converter 44 has its output terminal connected to an input terminal of said low-pass filter 43. The micro-computer 45 coupled to said D/A converter 44 generates signals for controlling the input single tuning filter 40 and the output single tuning circuit 42.

Subsequently, functioning of the double super-heterodyne tuner having constructions as described so far will be explained.

In FIG. 4, the signal inputted from the terminal A passes through the input single tuning filter 40, and is amplified by the RF amplifier 41 of the input/output high impedance. The output signal of the RF amplifier 41 is applied to the first mixer 6 through the single tuning circuit 42 which becomes the output load of the RF amplifier 41. Since the construction and functioning of the arrangement after the first mixer 6 are generally the same as those in the conventional arrangement described earlier with reference to FIG. 1, a detailed description thereof is abbreviated here for brevity of explanation, with like parts being designated by like reference numerals. Meanwhile, to the input single tuning filter 40 and the output single tuning circuit 42, tuning voltages corresponding to respective channel frequencies are supplied from the terminal I. Data for the tuning voltages corresponding to the respective channel frequencies are supplied from the micro-computer 45, and converted into D.C. voltages by the D/A converter 44 and the following low-pass filter 43 so as to be supplied from the terminal I. Although D.C. voltages corresponding to the respective channels are also supplied to the first local oscillator 7 from a terminal H connected to said oscillator 7, since such D.C. voltages are different in the variation ratio for the respective channels from the voltages to be supplied from the terminal I, they are supplied separately. The supply of the D.C. voltages to the terminal H can also be effected by the micro-computer 45.

Figure 5:
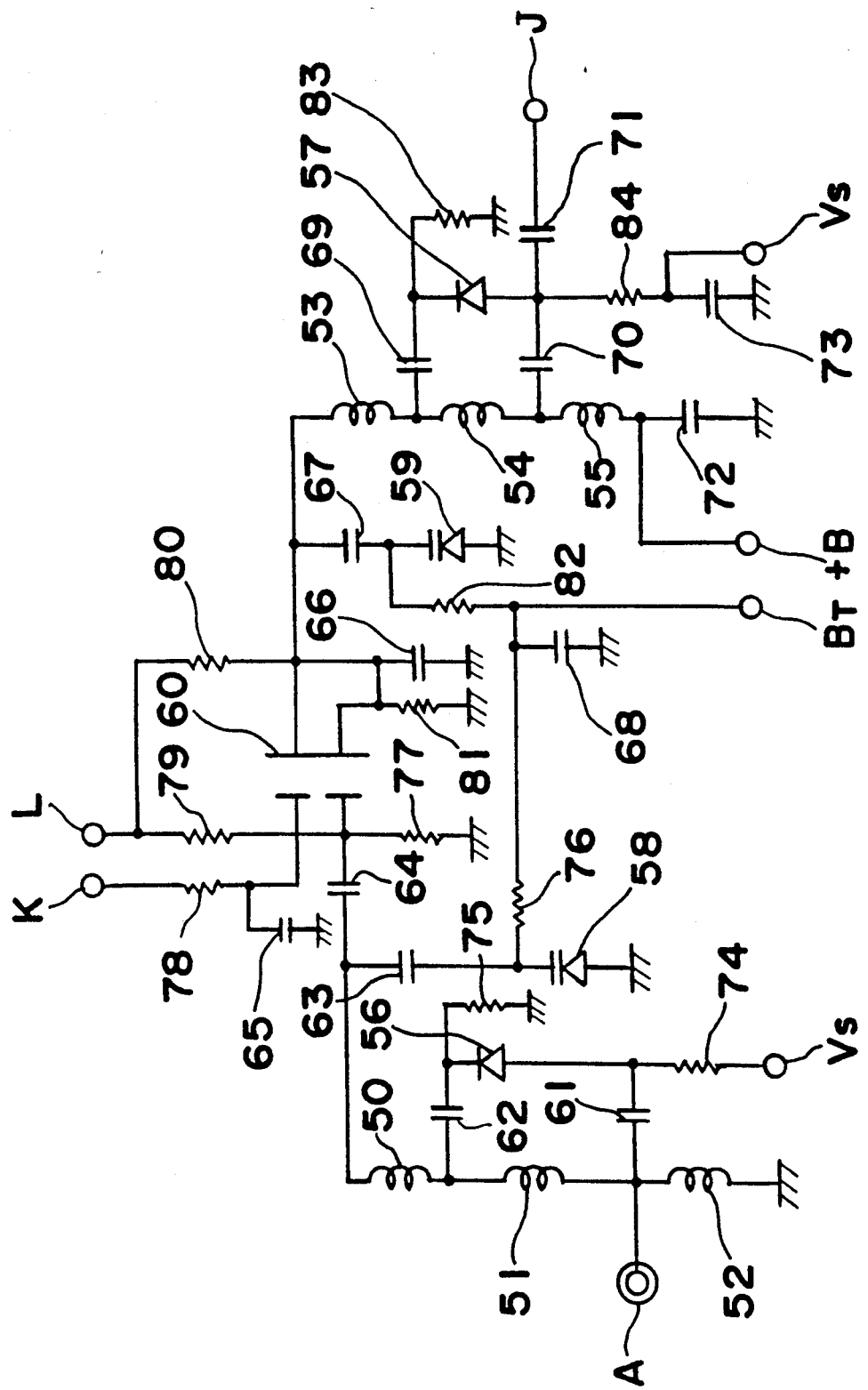
FIG. 5 is a circuit diagram showing a circuit construction of a portion of the tuner shown in FIG. 4.

Reference is also made to a circuit diagram of FIG. 5 showing one specific example for the input single tuning filter 40, the RF amplifier 41 and the output single tuning circuit 42 in FIG. 4.

In FIG. 5, the circuit generally includes tuning coils 50, 51, 52, 53, 54 and 55, switching diodes 56 and 57, a vari-cap diode 58 at the side of the input single tuning filter 40, another vari-cap diode 59 at the side of the output single tuning circuit 42, a field effect transistor (FET) 60 constituting the RF amplifier 41, capacitors 61, 62, 63, 64, 65, 66, 67, 68, 69, 70, 71, 72 and 73, and resistors 74, 75, 76, 77, 78, 79, 80, 81, 82, 83 and 84 connected to each other as illustrated.

More specifically, the coils 50 to 52 are connected in series to each other, with the terminal A connected between the coils 51 and 52 and further, to a junction between the anode of the diode 56 and the resistor 74 connected to Vs, through the capacitor 61, while a junction between the coils 50 and 51 is connected to the cathode of the diode 56 through the capacitor 62, and further to ground via the resistor 75. A junction between the coil 50 and one end of the capacitor 64 is connected to ground through the capacitor 63 and the vari-cap diode 58 and the other end of the capacitor 64 is connected to a first gate of the field effect transistor 60 and also grounded through the resistor 77 and further connected to a terminal L through the resistor 79. Another terminal K is connected to a second gate of the field effect transistor 60 through the resistor 78 and also grounded through the capacitor 65. A junction between the terminal L and the resistor 79 is grounded through the resistor 80 and the capacitor 66, with a junction therebetween being connected to the source of the field effect transistor 60 and to ground through a resistor 81. The drain of the field effect transistor 60 is connected to ground through the capacitor 67 and the vari-cap diode 59, with a junction therebetween being connected to BT through the resistor 82, which is further grounded by the capacitor 68, and connected to a junction between the capacitor 63 and the vari-cap diode 58 through the resistor 76. The drain of the field effect transistor 60 is further connected to the coils 53, 54 and 55 connected in series to each other and further connected to ground through the capacitor 72 and also to a terminal +B. A junction between the coils 53 and 54 is connected to ground through the capacitor 69, the diode 57, the resistor 84 and the capacitor 73, with a junction between the resistor 84 and the capacitor 73 being connected to a terminal Vs, while the cathode of the diode 57 is also connected to ground through the resistor 83. A junction between the coils 54 and 55 is connected to a terminal J through the capacitors 70 and 71.

By the above arrangement, the signal inputted from the terminal A is tapped up by the coils 50 to 52, and is supplied to the single tuning circuit constituted by the capacitor 63 and the vari-cap diode 58, so as to be tuned to the frequency of each channel by the BT voltage (tuning voltage) supplied through the resistor 76. The signal for the selected channel is applied to the RF amplifier 41 constituted by the field effect transistor 60 through the coupling capacitor 64. To the second gate of the field effect transistor 60, i.e. RF amplifier 41, an AGC voltage is applied from the AGC terminal K through the resistor 78 and controls the second gate voltage according to the input signal, thereby to adjust the amplifier gain. Meanwhile, to the output load of the RF amplifier 41, the single tuning circuit 42 constituted by the coils 53 to 55, the capacitor 67 and the vari-cap diode 59 is connected. In the above single tuning circuit 42, the signal is also tuned with respect to each channel frequency by the BT voltage (tuning voltage) supplied through the resistor 82. This signal is tapped down so as to be inputted to the first mixer 6 at the subsequent stage from a terminal J through the coupling capacitor 71. The change-over with respect to each band is effected by turning ON or OFF the switching diodes 56 and 57 by the voltage supplied from the terminal Vs. During the ON period of the switching diodes 56 and 57, the air-core coils 51 and 54 are brought into the short-circuited state, for switching over to the VHF high band and CATV band sides.

As is clear from the foregoing description, by the construction of the double super-heterodyne tuner according to the present invention, block filters required for the respective bands may be dispensed with, and the change-over circuit for each band can be comparatively reduced in the number of parts, while, since the second gate of the transistor is utilized for the automatic gain control (AGC), the circuit construction may be simplified. Moreover, owing to the arrangement that the tuning voltage is separately provided apart from the first local oscillator, tracking becomes unnecessary, and therefore, no critical adjustment is required. Furthermore, since it is not required to take image interference into consideration as in the single super-heterodyne tuner, the tuning circuit between the RF amplifier and the mixer need not be made into the double tuning type, and consequently, variation of the waveform within the band for each channel may be improved.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A double super-heterodyne tuner which comprises: a single tuning input filter for receiving an input signal; an RF amplifier connected to an output of said input filter; an interstage single tuning circuit and connected to an output of said RF amplifier; a mixer connected to an output of said inter-stage tuning circuit; and a first local oscillator which supplies an oscillation output signal to said mixer; wherein said input filter and said inter-stage tuning circuit are supplied with a variable tuning voltage which is different from a variable tuning voltage which is supplied to said first local oscillator; and wherein a relationship between a frequency of said input signal to said input filter and a value of said variable tuning voltage supplied to said input filter and inter-stage tuning circuit needed to optimally tune that input signal frequency is different from a relationship between a desired frequency of said oscillation output signal and a value of said variable tuning voltage supplied to said first local oscillator and needed to produce said desired frequency.

2. A double super-heterodyne tuner as claimed in claim 1, wherein said RF amplifier comprises a field effect transistor having a gate which is supplied with an AGC voltage.

3. A double super-heterodyne tuner which comprises: a single tuning filter for receiving an input signal, an RF amplifier connected to an output of said input filter; an inter-stage single tuning circuit and connected to an output of said RF amplifier, a first mixer inputted with an output signal of said inter-stage tuning circuit and an output signal of a first local oscillator having a variable oscillating output frequency, and a second mixer having as inputs, an output signal of said first mixer and an output signal of a second local oscillator having a fixed oscillating output frequency, said first local oscillator being supplied with a first variable tuning voltage which varies; wherein said input filter and said inter-stage tuning circuit are both simultaneously supplied with a second tuning voltage, said second tuning voltage being different from said first tuning voltage but also varying, wherein a relationship between a frequency of said signal input to said input filter and a value of said second tuning voltage needed to optimally tune that input signal frequency is different from a relationship between a desired frequency of said variable oscillating output and a value of said first tuning voltage needed to produce said desired frequency.

* * * * *